(12) United States Patent
Soltero et al.

(10) Patent No.: US 6,351,174 B2
(45) Date of Patent: Feb. 26, 2002

(54) VCC-COMPENSATED BUS-HOLD CIRCUIT

(75) Inventors: Jose M. Soltero; Dale P. Stein, both of Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/754,514

(22) Filed: Jan. 4, 2001

Related U.S. Application Data

(60) Provisional application No. 60/184,523, filed on Feb. 24, 2000.

(51) Int. Cl.[7] ................................................. H03L 5/00
(52) U.S. Cl. ....................................... 327/333; 327/538
(58) Field of Search ................................. 327/333, 379, 327/530, 534, 538, 543, 545, 546; 326/62, 86

(56) References Cited

U.S. PATENT DOCUMENTS 5,828,233 A * 10/1998 Nguyen et al. ............... 326/86
5,973,530 A * 10/1999 Morris et al. ................ 327/333

OTHER PUBLICATIONS

"Implication of Slow or Floating CMOS Inputs" by Texas Instruments, Feb. 1998.

* cited by examiner

Primary Examiner—Kenneth B. Wells
Assistant Examiner—Paul Dinh
(74) Attorney, Agent, or Firm—J. Dennis Moore; W. James Brady, III; Frederick J. Telecky, Jr.

(57) ABSTRACT

A hold circuit for holding a digital switch, having an input and an output, at the level of the last driven state substantially independently of the output impedance of a circuit driving the digital switch. The hold circuit includes an inverter having an input connected to the output of the digital switch and having an output, and a variable resistor having a port connected to the output of the inverter and having a port connected to the input of the digital switch. In a preferred embodiment, a bus-hold integrated circuit servicing Insulated Gate FET digital switches can be operated from either of two distinct ranges of supply voltage ($V_{CC}$). The magnitudes of the holding currents for the higher range of $V_{CC}$ are nearly the same as those for the lower range of $V_{CC}$. This characteristic is achieved by changing the resistance in the feedback path of the bus-hold circuit according to the applied $V_{CC}$. Resistance is increased by turning off wider channel IGFETs that are connected in parallel with narrower channel IGFETs when the higher range of $V_{CC}$ is applied. When the lower range of $V_{CC}$ is applied the wider channel IGFETs are switched on and the resistance of the holding current path is decreased in proportion to the decrease in $V_{CC}$.

8 Claims, 3 Drawing Sheets

VCC-COMPENSATED BUS-HOLD CIRCUIT

This application claims priority under 35 U.S.C. §119 (e)(1) of provisional application No. 60/184,523, filed Feb. 24, 2000.

TECHNICAL FIELD OF THE INVENTION

The present invention relates to the field of hold circuits, such as bus-hold circuits. More particularly, it relates hold circuits that may be used with power supplies of differing supply voltage.

BACKGROUND OF THE INVENTION

An IGFET circuit used as a digital switch can be left with a floating input either by design or in bus applications when all devices driving the bus are in 3-state. In this state the transistors on both sides of the driving circuits are turned off leaving them with high output impedance. A floating input of an IGFET circuit allows the capacitance of the IGFET gate to gradually charge. If the gate is sufficiently charged, the resulting voltage on the gate causes static current to flow through the IGFET, causing wasted power dissipation. Further, if the gate voltage rises even further, it can reach a certain threshold where a more serious consequence can occur. In the worst case condition, it can draw enough current from the supply to ground to destroy the metal lead and render the device useless.

Initially, external static pull-up or pull-down resistors were used to prevent floating of unused gates. These static resistors connect the gate either to the supply voltage, $V_{CC}$, or ground, but still cause wasted power dissipation. For bus applications where a bus driver must drive the input, bus-hold circuits have been developed. The function of a bus-hold circuit is to hold the input of the digital switch, i.e., the gate of the IGFET, to the state previously set by the bus driver. The hold must be strong enough to prevent the input from floating (charging) but weak enough to allow the input to be driven by the bus driver. Initially, these were external circuits. Now bus-hold circuits are integrated into the IGFET (including CMOS) digital IC.

In the known art, a bus-hold circuit is a digital signal feedback path from the output of a digital switch to its input, consisting of an inverter and a current-limiting resistor. The purpose of the feedback is to hold the input to its last driven state until it is driven to the alternate state. Current flows through the resistor only during the switching period when, due to propagation delays, there is a voltage difference between the output of the inverter and the input of the digital switch. Since voltage drops across the resistor occur only for brief intervals during state changes, bus-hold circuits significantly reduce the power dissipation.

The holding current through the resistor becomes the critical parameter for power dissipation by a bus-hold circuit. The magnitude of the holding current depends upon the values of the resistor and $V_{CC}$. If the bus-hold circuit is used with a higher value of $V_{CC}$ then the magnitude of the hold override current is proportionately higher and the circuit dissipates more power in proportion to the square of the current.

Historically, the values of $V_{CC}$ for digital switches on IGFET integrated circuits have decreased as the state of the technology progresses. For CMOS, they have diminished from 5V to 3.3V, to 2.5V and to 1.8V. It is likely that this progression to still lower values of $V_{CC}$ will continue. An important benefit of evolving the technologies to operate from a lower value of $V_{CC}$ is that the magnitudes of the hold override currents also are reduced. That lowers the power consumption of the bus-hold circuit. This evolution to lower $V_{CC}$ creates the need for bus-hold circuits that can operate at two different values of $V_{CC}$ so it can be used with either version of the technology.

SUMMARY OF THE INVENTION

The present invention provides a hold circuit for holding a digital switch, having an input and an output, at the level of the last driven state substantially independently of the output impedance of a circuit driving the digital switch. The hold circuit includes an inverter having an input connected to the output of the digital switch and having an output, and a variable resistor having a port connected to the output of the inverter and having a port connected to the input of the digital switch.

In accordance with a preferred embodiment of the present invention, a $V_{CC}$-compensated bus-hold circuit is provided that can operate from either of two adjacent values of $V_{CC}$ without increasing the holding currents at the higher value of $V_{CC}$. This duality in circuit behavior results from introducing a variable resistor (whose resistance depends on which of the two values of $V_{CC}$ is applied) between the bus-hold inverter and the current limiting resistor. The dual-valued variable resistor is implemented using two transistors of different strengths connected in parallel. The transistor with the smaller channel width and therefore higher resistance is biased on continuously. When the lower value of $V_{CC}$ is applied, the transistor with the larger channel width and therefore lower resistance is also turned on and the parallel combination has a lower resistance. When the higher value of $V_{CC}$ is applied, the transistor with the larger channel width is turned off and the parallel combination then has a higher resistance. A bias circuit with $V_{CC}$ as input supports the operation of this embodiment. This bias circuit uses the $V_{CC}$ value to control the state (ON or OFF) of that transistor in the parallel pair that has the larger channel width. If the lower value of $V_{CC}$ is applied then the transistor with the larger channel width is turned on and the resistance is lowered. If the higher value of $V_{CC}$ is applied then that transistor is turned off and the resistance is increased to a value that keeps the magnitudes of the holding currents approximately the same as for the lower value of $V_{CC}$.

DETAILED DESCRIPTION OF THE PREFERRED EMBODIMENTS

Figure 1:
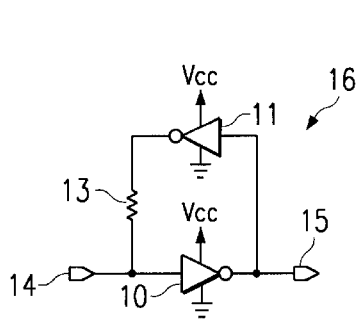
FIG. 1 illustrates a prior art bus-hold circuit.

FIG. 1 illustrates a known art bus-hold circuit consisting of an inverter 11 and a resistor 13 that are connected in series from the output to the input of an IGFET switch 10. If the input 14 is in a low state then the output 15 is in a high state.

This puts the output of inverter 11 in a low state, and resistor 13 becomes a pull-down resistor with current flowing through it only during the switching period when there is a voltage difference between the output of 11 and the input of 10. Conversely, when the input 14 is high, the output 15 is low and the output of inverter 11 is high. In this state, resistor 13 is a pull-up resistor and current flows through it only during the switching period when there is a voltage difference between the output of 11 and the input of 10. Since voltage drops across resistor 13 occur only for brief intervals during state changes, as mentioned above bus-hold circuits significantly reduce the power dissipation.

Figure 2:
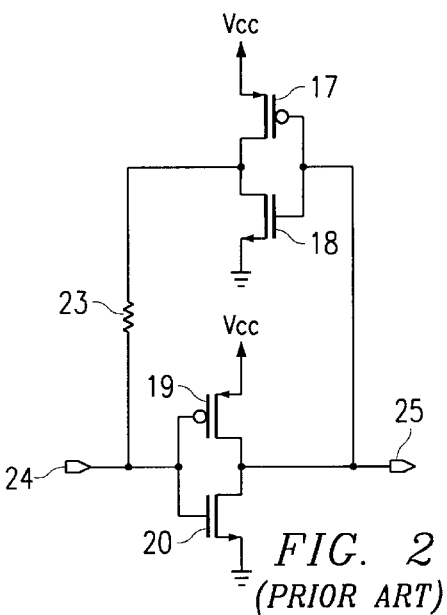
FIG. 2 shows an example of a prior art bus-hold circuit implemented in CIGFET technology.

FIG. 2 illustrates a Complementary IGFET (CIGFET) implementation of the known art bus-hold circuit 16. CMOS is a special case of the more general class of CIGFET circuits. CIGFET transistor pair 17 & 18 forms the inverter of the bus-hold circuit. The digital switch 3 is also a pair of CIGFET transistors 19 & 20.

Figure 3:
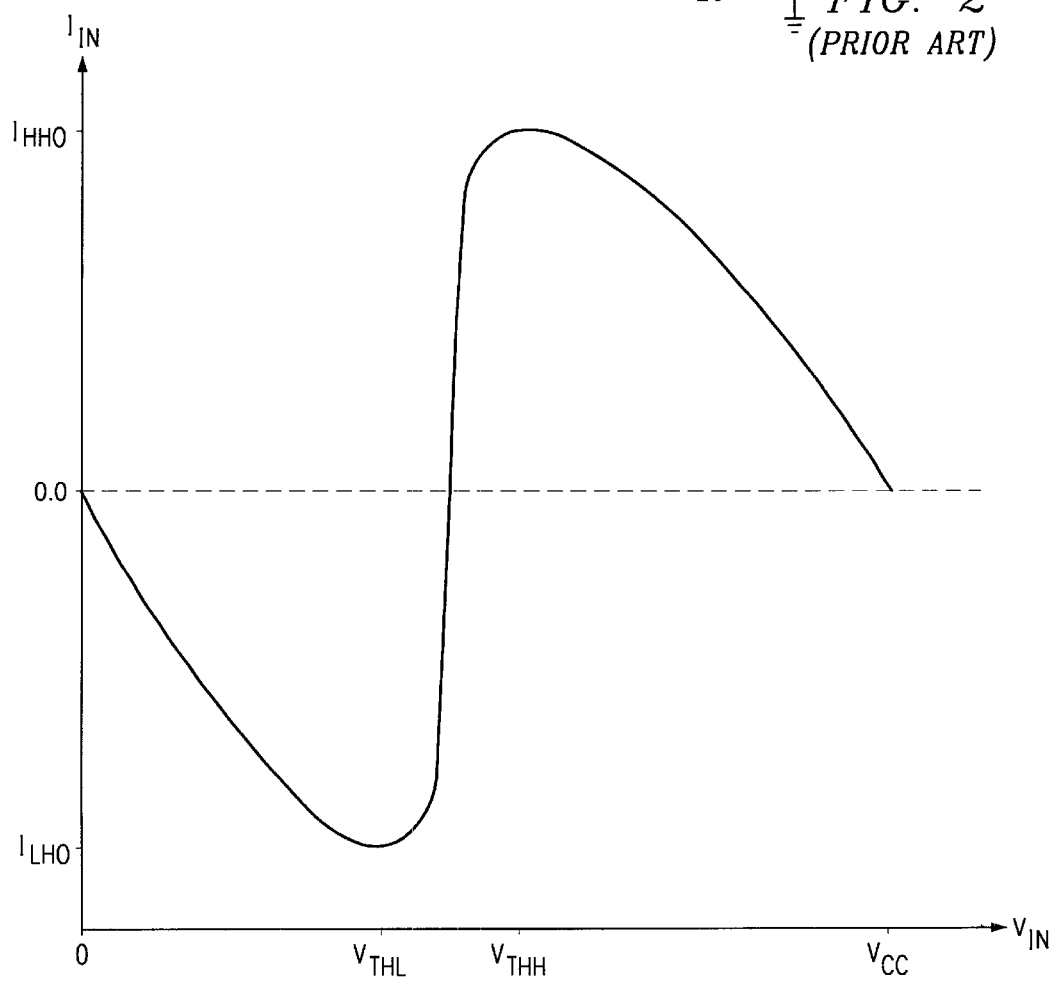
FIG. 3 is a graph of the typical holding current characteristics of a prior art bus-hold circuit.

FIG. 3 is a graphical plot of input current ($I_{IN}$) versus input voltage ($V_{IN}$) that characterizes the operation of a typical bus-hold circuit. Referring now also to FIG. 1, $I_{IN}$ is defined as the current that flows from the output of the inverter through resistor 13 to the digital switch input 14. When the input is in the low state, $V_{IN}<V_{THL}$ (the threshold voltage at which the output of digital switch 10 remains in the high state). As the voltage at the input is driven from zero toward $V_{THL}$ the value of $I_{IN}$ slowly begins to fall from zero toward $I_{LHO}$, the low hold override current (also called the holding current, $I_{HOLD}$). Near $V_{IN}$=zero, the magnitude of the current is set by the value of resistor 13 (or 23, FIG. 2), and by the voltage difference between the input 14 (or 24, FIG. 2) and the output of inverter 11. As $V_{IN}$ approaches $V_{THL}$, $I_{IN}$ reaches its maximum negative value $I_{LHO}$. Increasing $V_{IN}$ further strengthens the n-channel transistor and weakens the p-channel transistor of the digital switch, identified in FIG. 2 as transistors 20 and 19, respectively, thus forcing 15 (or 25, FIG. 2) to a low state and the output of the bus-hold circuit to a high state. $I_{IN}$ reverses and rises rapidly until $V_{IN}$ reaches $V_{THH}$ (the threshold voltage at which the output of digital switch 10 remains in the low state). At this point, $I_{IN}$ reaches its maximum positive value $I_{HHO}$, the high hold override current. As $V_{IN}$ approaches $V_{CC}$, $I_{IN}$ falls back to zero at a rate determined by the value of resistor 13 and the voltage difference between the output of inverter 11 and the input 14 to the digital switch. As the input 14 is driven from a high state to a low state, a similar process occurs as determined by this same $I_{IN}$–$V_{IN}$ curve.

Referring to FIG. 2, the magnitudes of the hold override currents ($I_{LHO}$ and $I_{HHO}$) depend upon the values of resistor 23 and $V_{CC}$. Therefore, when the bus-hold circuit 16 is used with a higher value of $V_{CC}$ (for example, $V_{CC}$=5V, instead of $V_{CC}$=3.3V), the magnitudes of the hold override currents are proportionately higher and more power is dissipated by the circuit.

Figure 4:
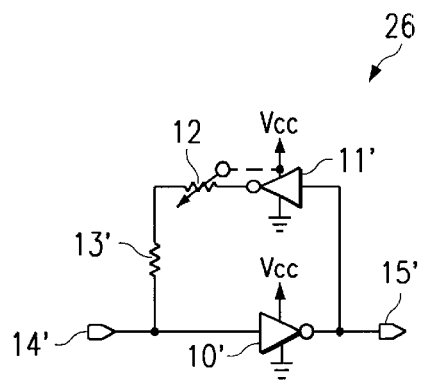
FIG. 4 illustrates a first preferred embodiment of the present invention.

FIG. 4 shows a bus-hold circuit according to a first preferred embodiment of the present invention. A variable resistor 12 is provided in the bus-hold circuit between the inverter output and the resistor 13', allowing the circuit to be operated with either of two prescribed values of supply voltage ($V_{CC}$). The resistance of 12 switches between two values according to the value of the applied $V_{CC}$. If the lower value of $V_{CC}$ is applied then 12 has the lower value of resistance. If the higher value of $V_{CC}$ is applied then 12 has the higher value of resistance. The holding currents, $I_{LHO}$ and $I_{HHO}$, are thus made substantially independent of which of the two values of $V_{CC}$ is applied.

Figure 5:
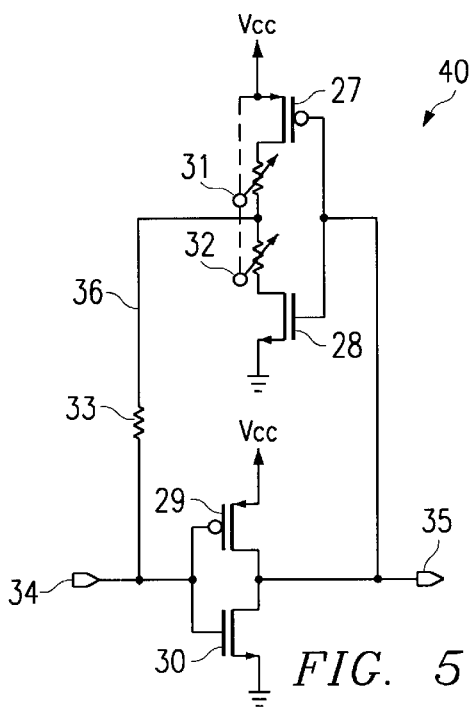
FIG. 5 illustrates a second preferred embodiment of the present invention, in a CIGFET digital switch IC.

FIG. 5 shows a bus-hold circuit according to a second preferred embodiment of the present invention, in a CIGFET bus-hold circuit. In a circuit of this type, the variable resistance is divided into two components, 31 and 32. When $V_{CC}$ is set at the higher value ($V_{CCH}$), 31 and 32 have higher resistance values. When $V_{CC}$ is set at the lower value ($V_{CCL}$), they have lower resistance values.

Figure 6:
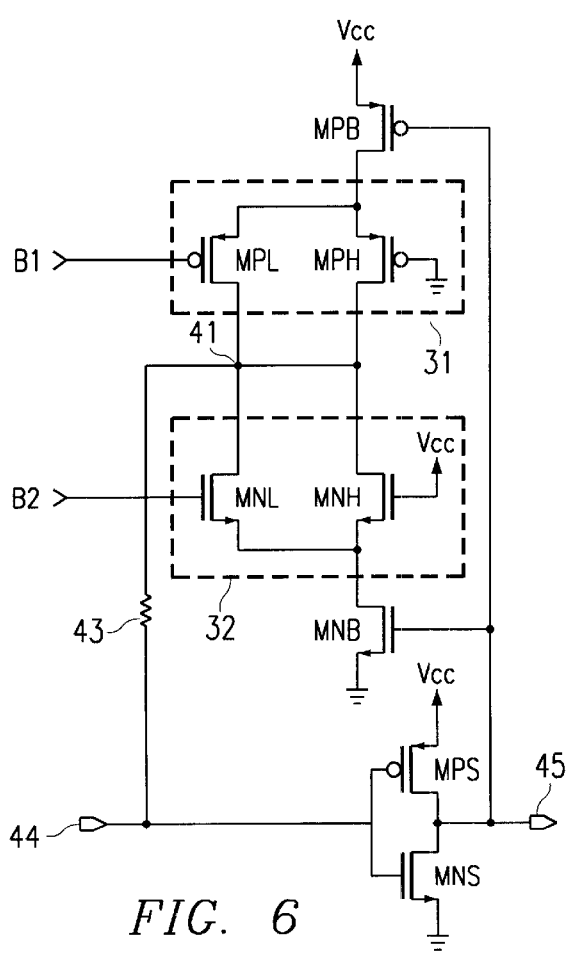
FIG. 6 shows a third preferred embodiment of the present invention.

FIG. 6, shows a third preferred embodiment of the present invention, which is a further application of the principles of the present invention to a CIGFET bus-hold circuit, but with enhancements over the circuit shown in FIG. 5. In the circuit shown in FIG. 6, four CIGFET switches (MPL, MNL, MPH and MNH) implement the two-state variable resistors 31 and 32 shown in FIG. 5. The drains of the digital switch CIGFET pair MPS and MNS at the output 45 are connected to the input gates of the bus-hold inverter CIGFET pair MPB and MNB. The drains of MPB and MNB are tied together at the node 41 on the bus-hold side of a current-limiting resistor 43 through two CIGFET pairs MPL/MNL, MPH/MNH, connected in parallel. The opposite side of resistor 43 is connected to the input 44 of the digital switch. The sources of MPL and MPH are connected to the drain of MPB. The sources of MNL and MNH are connected to the drain of MNB. The drains of MPL, MPH, MNL and MNH are connected to the node 41. The source of MPB and the gate of MNH are connected to $V_{CC}$. The source of MNB and the gate of MPH are connected to ground. The gate of MPL is connected to a first bias source B1, while the gate of MNL is connected to a second bias source B2.

A $V_{CC}$-dependent bias circuit provides the bias sources B1 and B2. This bias circuit has two outputs, B1 and B2, where B1 and B2 have the following characteristics:

1. If $V_{CC}$=$V_{CCL}$ then B1=0.0V and B2=$V_{CC}$
2. If $V_{CC}$=$V_{CCH}$ then B1=$V_{CC}$ and B2=0.0V As mentioned above, the gate of MPL is connected to the bias circuit output B1, while the gate of MNL is connected to bias circuit output B2. Since B2 is, in a sense, the complement or inverse of B1, CIGFET MPL and CIGFET MNL are either turned on or turned off in unison.

Transistors MPL and MNL are fabricated to have larger channel widths than transistors MPH and MNH. Thus they provide a lower resistance path for current when they are turned on. As such, their function can be considered in this context to be, effectively, that of resistors. If the value of $V_{CC}$ is at $V_{CCL}$, then MPL and MNL are enabled. This creates current paths through these two effective resistors. Resistor 31 is formed by the parallel combination of the lower channel resistance of MPL and the higher channel resistance of MPH. Resistor 32 is formed by the parallel combination of the lower channel resistance of MNL and the higher channel resistance of MNH. When $V_{CC}$ is at $V_{CCH}$, then MPL and MNL are switched off and the values of the effective resistors 31 and 32 become the higher channel resistances through MPH and MNH, respectively. This keeps the bus-hold currents for the higher value of $V_{CC}$ approximately the same as those for the lower value of $V_{CC}$. Thus, effective resistors 31 and 32 together comprise an effective variable resistor, wherein the variability is controlled by the switching on and off of MPL, MPH, MNL and MNH, as described above.

Figure 7:
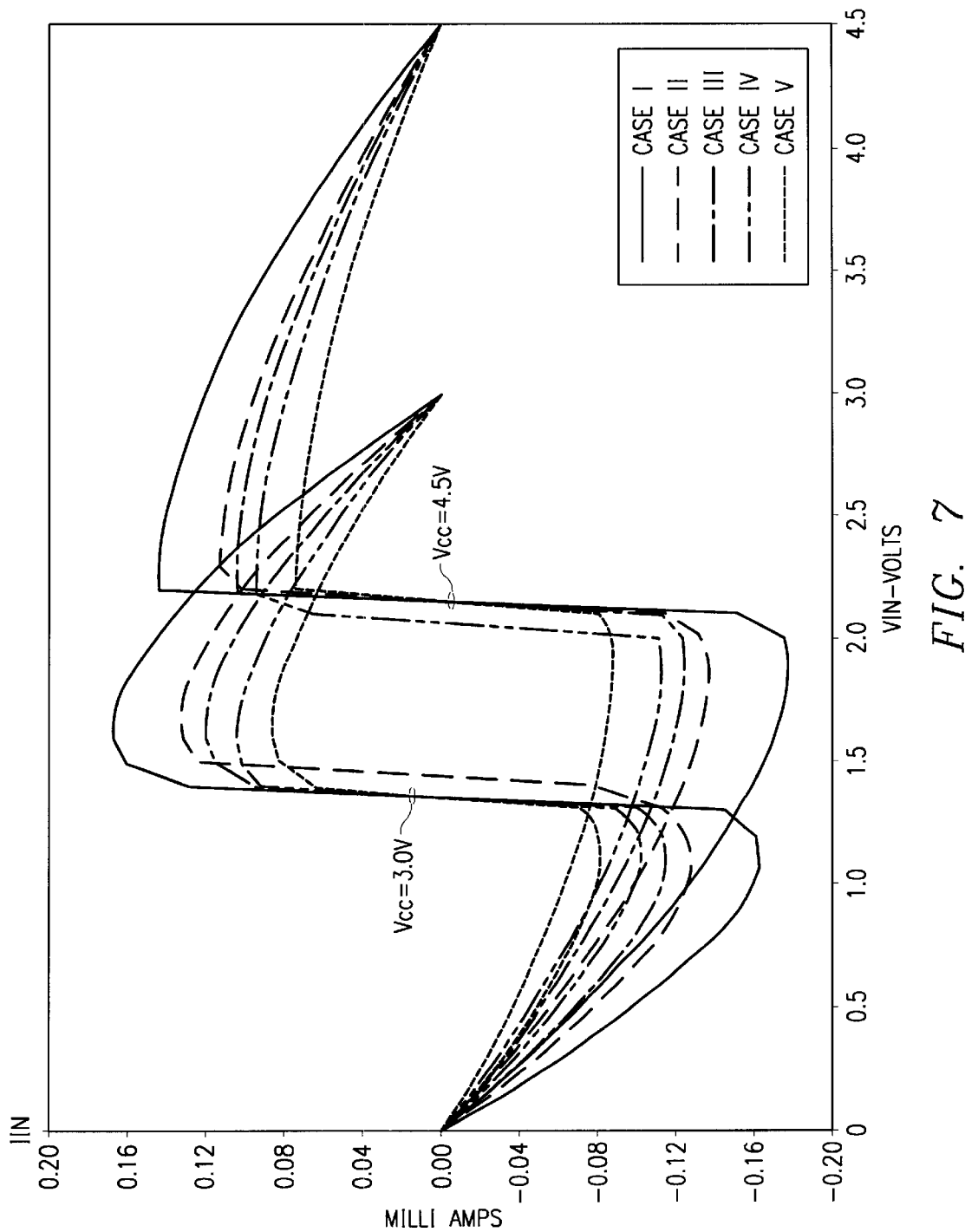
FIG. 7 illustrates the variation in holding currents of a preferred embodiment, for various conditions.

FIG. 7 shows the results of a transistor-level SPICE simulation of the embodiment shown in FIG. 6 for the specific $V_{CC}$ values: 3.0V and 4.5V. It shows two families of $I_{IN}$-versus-$V_{IN}$ characteristic curves for a variety of transistor strengths and device temperature conditions. The family of curves on the left side of FIG. 7 (which terminate in a common left end point and a common right end point) were obtained for $V_{CC}$=3.0V. The family of curves on the right side were obtained for $V_{CC}$=4.5V. The curves in FIG. 7 show that in each case (I through V) of transistor strength and device temperature, the values of the hold override currents ($I_{LHO}$ and $I_{HHO}$) for $V_{CC}$=4.5V are very nearly the same as those for 3.0V.

Although the present invention and its advantages have been described in detail, it should be understood that various changes, substitutions and alterations can be made herein without departing from the spirit and scope of the invention as defined by the appended claims.

We claim:

1. A hold circuit for holding a digital switch, said digital switch having an input and an output, at the level of the last driven state substantially independently of the output impedance of a circuit driving said digital switch, said hold circuit comprising:

an inverter having an input connected to said output of said digital switch and having an output; and a variable resistor having a port connected to the output of said inverter and having a port connected to the input of said digital switch, wherein said digital switch is powered by a power supply having a supply voltage, and wherein the value of said supply voltage may be in either of two different ranges, further comprising a circuit for determining a resistance value of said variable resistor, said resistance value being determined by the value of the supply voltage that is applied to the hold circuit.

2. A hold circuit for holding a CIGFET digital switch, said CIGFET digital switch having an input and having an output and comprising a first p-channel IGFET and a first n-channel IGFET, at the level of its last driven state regardless of whether the output impedance of the bus driver is high or low, said hold circuit comprising:

a CIGFET inverter comprising a second p-channel IGFET having a gate, a drain and a source, said source being tied to a supply voltage, and a second n-channel IGFET having a gate, a drain and a source, said source being tied to ground, the gates of both of said IGFETs being driven by the output of the CIGFET digital switch;

a first variable resistor, connected between the drain of said second p-channel IGFET and a first port of a fixed resistor;

a second variable resistor, connected between the drain of said second n-channel IGFET and said first port of said fixed resistor; and a second port of said fixed resistor being connected to the input of said CIGFET digital switch.

3. The hold circuit of claim 2, wherein said CIGFET digital switch is powered by a power supply having a supply voltage, and wherein the value of said supply voltage may be in either of two different ranges, a higher range and a lower range, further comprising:

a first circuit for determining a resistance value of said first variable resistor, said resistance value being determined by the value of the supply voltage that is applied to the hold circuit a second circuit for determining a resistance value of said second variable resistor, said resistance value being determined by the value of the supply voltage that is applied to the hold circuit.

4. The hold circuit of claim 2, wherein:

said first variable resistor is implemented by a pair of CIGFETs connected in parallel between the drain of said second p-channel IGFET of said inverter and said first port of said fixed resistor, and said second variable resistor is implemented by a pair of CIGFETs connected in parallel between the drain of said second n-channel IGFET of said inverter and said first port of said fixed resistor.

5. The hold circuit of claim 4, wherein said first variable resistor comprises:

a wide p-channel IGFET having a source, a gate and a drain, said gate being tied to a first bias input, a narrow p-channel IGFET having a source, a gate and a drain, said gate being tied to ground, the sources of both said wide p-channel IGFET and said narrow p-channel IGFET being connected together at the drain of said second p-channel IGFET, and the drains of both said wide p-channel IGFET and said narrow p-channel IGFET being connected together at said first port of said fixed resistor.

6. The hold circuit of claim 4, wherein said second variable resistor comprises:

a wide n-channel IGFET having a source, a gate and a drain, said gate being tied to a second bias input, a narrow n-channel IGFET having a source, a gate and a drain, said gate being tied to said power supply, the sources of both said wide n-channel IGFET and said narrow n-channel IGFET being connected together at the drain of said second n-channel IGFET, and the drains of both said wide n-channel IGFET and said narrow n-channel IGFET being connected together at said first port of said fixed resistor.

7. The hold circuit of claim 5, wherein:

said wide p-channel IGFET is turned on by said first bias input when the applied supply voltage is in said lower range of said supply voltage, and said wide p-channel IGFET is turned off by said first bias input when the applied supply voltage is in said higher range of said supply voltage.

8. The hold circuit of claim 6, wherein:

said wide n-channel IGFET is turned on by said second bias input when the applied supply voltage is in said lower range of said supply voltage, and said wide n-channel IGFET is turned off by said second bias input when the applied supply voltage is in said higher range of said supply voltage.

* * * * *